United States Patent [19]
Huang et al.

[11] Patent Number: 6,130,847
[45] Date of Patent: Oct. 10, 2000

[54] SEMICONDUCTOR DEVICE WITH FAST WRITE RECOVERY CIRCUIT

[75] Inventors: Shih-Huang Huang, Hsunchu, Taiwan; Hsin-Pang Lu, Hsinchu, Taiwan

[73] Assignees: United Microelectronics Corp.; United Silicon Incorporated, both of Hsinchu, Taiwan

[21] Appl. No.: 09/358,339

[22] Filed: Jul. 21, 1999

[51] Int. Cl.$^7$ .................................................. G11C 7/00
[52] U.S. Cl. .................... 365/203; 365/194; 365/202; 365/205
[58] Field of Search ................... 365/194, 202, 365/203, 205, 222

[56] References Cited

U.S. PATENT DOCUMENTS

| | | |
|---|---|---|
| 5,467,312 | 11/1995 | Albon et al. ............... 365/203 X |
| 5,539,701 | 7/1996 | Shimizu .................... 365/202 X |
| 5,761,123 | 6/1998 | Kim et al. .................. 365/202 X |
| 5,777,935 | 7/1998 | Patelakis et al. ............. 365/203 |

*Primary Examiner*—Huan Hoang
*Attorney, Agent, or Firm*—Thomas, Kayden, Horstemeyer & Risley

[57] ABSTRACT

A semiconductor memory device including a fast write recovery circuit. The semiconductor memory device has a memory array, a sense amplifier and the fast write recovery circuit. Before the end of a precharging operation, a last bit of data is written into a memory cell of the memory by the sense amplifier, as well as by the fast write recovery circuit from the other end. Thus, the time required for writing the last bit of data is shortened to prevent from writing a fragmental data into the memory cell in a transient write cycle. Furthermore, a write operation with a high speed can be executed with being restricted by layout.

9 Claims, 5 Drawing Sheets

SEMICONDUCTOR DEVICE WITH FAST WRITE RECOVERY CIRCUIT

BACKGROUND OF THE INVENTION

1. Field of the Invention

The invention relates in general to a memory. More particularly, this invention relates a semiconductor memory device with a fast write recovery circuit which greatly reduces the write recovery time.

2. Description of the Related Art

In a conventional semiconductor memory device such as a dynamic random access memory (DRAM), a waiting period of time is required for writing a last bit of data into the memory device through only a sense amplifier at one end before activating a precharge command and after a write cycle. This waiting period is very often prolonged. Thus, when the operation speed of the DRAM is enhanced, the last bit data is very often written into the memory device fragmentarily.

For example, as shown in FIG. 1, a circuit diagram of a conventional semiconductor memory device is illustrated. The semiconductor memory device includes a memory array 100 and a sense amplifier 110. In the FIG. WL1 to WLn indicate word lines, while BL and BLB are a pair of complementary bit lines. In addition, DL and DLB are a pair of complementary data lines. COL is a column select signal, NSA and PSA are corresponding sense amplified enabling signals. For example, while NSA is a low level ground signal, PSA is then a high level voltage signal.

In a precharge cycle, the bit lines BL and BLB are pulled to a voltage level VBLR (=½ VDDA). At the beginning of a write cycle, an arbitrary one of the word lines WL1 to WLn is selected by a row select signal. Meanwhile, the charges saved in the memory cell and the capacitors of bit line BL or BLB are shared to result in a voltage difference between the bit lines BL and BLB. Being amplified by the sense amplifier, the bit lines BL and BLB are pulled up to a high voltage simultaneously.

A column select signal COL and a write in pulse signal are then triggered, one of the datalines DL and DLB is pulled down to a low voltage and the corresponding bit line BL or BLB is pulled down to the low voltage too. The potential difference between the bit lines BL and BLB is then amplified by the sense amplifier. Meanwhile, the column select signal COL and the write pulse signal are turned off, data are written into the memory cell merely by the sense amplifier.

After writing a last bit of data, the memory cell pulls down the bit line WLn to a low voltage according to the precharge command and thus complete a write cycle. Thus, the bit lines BL and BLB are recovered to a precharge state (=½ VDDA). The time between the last bit of data and the precharge command is called a write recovery time. The write recover time enables the data to be written into the memory cell completely.

As the write cycles is getting shorter, the bandwidth of the write in pulse signal becomes narrower and the write recovery time is shortened, the data written into a memory cell is incompletely while a relative bit line is to cease a write operation to enter a precharge state before being fully pulled down to the low potential level or up to the high potential level. The possibility of device failure for memory device is thus greatly increased to obstruct the development of high writing operation speed. In other words, as the operation speed of a SRAM is quickened, the last bit of data written in the semiconductor memory device is fragmentary.

SUMMARY OF THE INVENTION

The invention provides a semiconductor memory device with a fast write recovery circuit. The semiconductor memory device includes a memory array, a sense amplifier and a fast write recovery circuit. The memory array comprises multiple memory cells coupled to a pair of bit lines. The sense amplifier connects across the bit line pair and a pair of data lines to write data in the data lines to the memory cells of the memory array. The fast write recovery circuit includes a first PMOS transistor, a second PMOS transistor, a third PMOS transistor and a fourth PMOS transistor. Sources regions of the first and the fourth PMOS transistors receive a write signal. A gate of the first PMOS transistor is coupled to drain regions of the third and the fourth PMOS transistors. A gate of the fourth PMOS transistor is coupled to drain regions of the first and the second PMOS transistors. Gates of the second and the third PMOS transistors receive a self time pulse signal WRB, and source regions of the second and the third PMOS transistors connect to the bit line pair, respectively.

In the memory device with a fast write recovery circuit provided by the invention, every bit of data is written into the memory cell by writing VDDA (high potential voltage source) from the other end through a fast write recovery circuit in addition to the sense amplifier and the write in driver. Therefore, the time required for writing data into the memory cell is reduced. Particularly, the write recovery time for the last bit of data to enter the precharge state can be greatly shortened. Thus, the possibility to write in an incomplete data is suppressed, and a high speed write operation of the memory device can be executed.

Both the foregoing general description and the following detailed description are exemplary and explanatory only and are not restrictive of the invention, as claimed.

DESCRIPTION OF THE PREFERRED EMBODIMENTS

Figure 1:
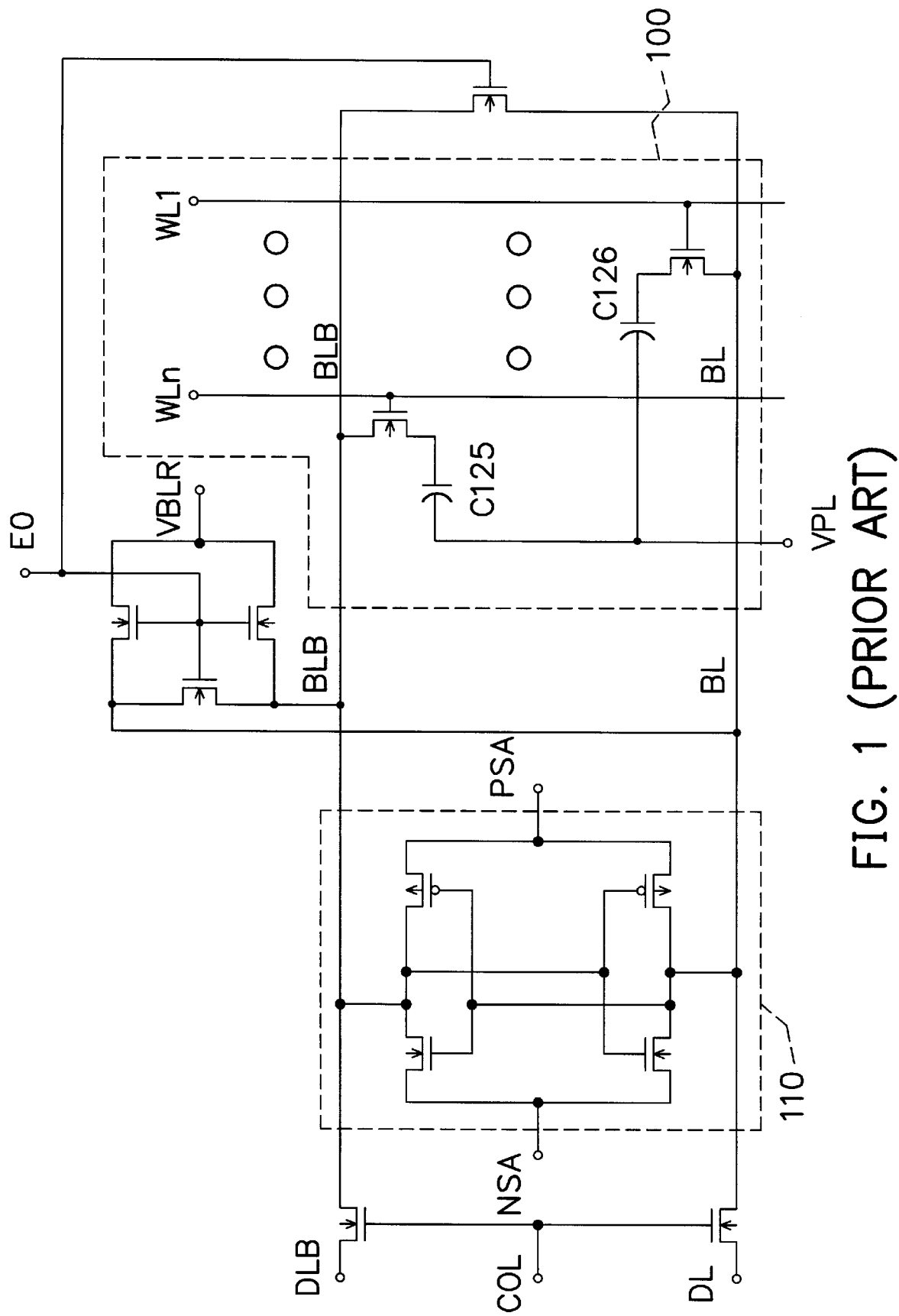
FIG. 1 shows a circuit diagram of a conventional semiconductor memory device.
Figure 2:
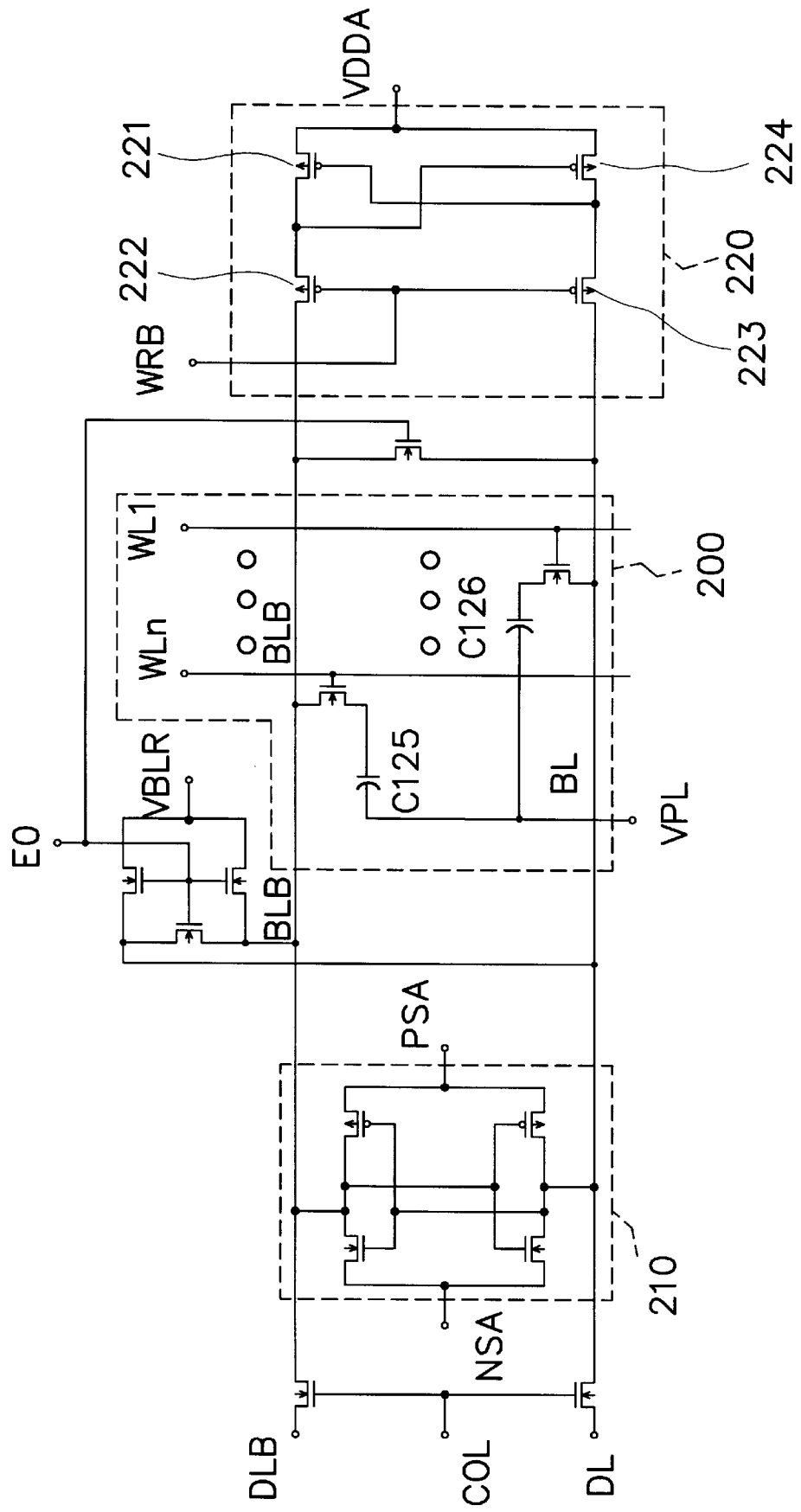
FIG. 2 shows a circuit diagram of a semiconductor memory device in a preferred embodiment of the invention.

FIG. 2 illustrates a circuit diagram of a semiconductor memory device in a embodiment of the invention. The semiconductor memory device comprises a memory array 200, a sense amplifier 210 and a fast write recovery circuit 220. The fast write recovery circuit 220 comprises four PMOS transistors 221 to 224. Source regions of the transistors 221 and 224 are to receive a write signal VDDA (a high potential level). A gate of the PMOS transistor 221 is coupled with drain regions of the PMOS transistors 223 and 224. A gate of the PMOS transistor 224 is coupled to drain regions of the PMOS transistors 221 and 222. Gates of the PMOS transistors 222 and 223 are to receive a self time pulse signal WRB. Source regions of the PMOS transistors 222 and 223 are coupled to bit lines BL and BLB, respectively.

In addition, WL1 to WLn are word lines, while BL and BLB are a pair of bit lines with a complementary relationship. DL and DLB are a pair of complementary data lines. COL is a column select signal. NSA and PSA are sense amplification enabling signal and counter sense amplification enabling signal. For example, while NSA is a low level ground signal (GND), PSA is a high level voltage signal (VDD).

In a precharge cycle, the bit lines BL and BLB are pulled to a voltage level VBLR (=½ VDDA). At the beginning of a write cycle, an arbitrary one of the word lines WL1 to WLn is selected by a row select signal. Meanwhile, the charges saved in the memory cell and the capacitors of bit line BL or BLB are shared to result in a voltage difference between the bit lines BL and BLB. Being amplified by the sense amplifier, the bit lines BL and BLB are pulled up to a high voltage simultaneously.

A column select signal COL and a write in pulse signal are then triggered, one of the datalines DL and DLB is pulled down to a low voltage and the corresponding bit line BL or BLB is pulled down to the low voltage too. The potential difference between the bit lines BL and BLB is then amplified by the sense amplifier. Meanwhile, the column select signal COL and the write pulse signal are turned off, data are written into the memory cell merely by the sense amplifier.

After writing a last bit of data, the memory cell pulls down the word lines WL1-WLn to a low voltage according to the precharge command and thus complete a write cycle. Thus, the bit lines BL and BLB are recovered to a precharge state (=½ VDDA). The time between the last bit of data and the precharge command is called a write recovery time. The write recover time enables the data to be written into the memory cell completely.

In the invention, in addition to use of a sense amplifier 210 to write a last bit of data, a data "1" of the write signal VDDA is written into the memory cell from the other end of the fast write recovery circuit 220. Therefore, the write recovery time can be greatly shortened without being restricted by the layout.

Figure 3:
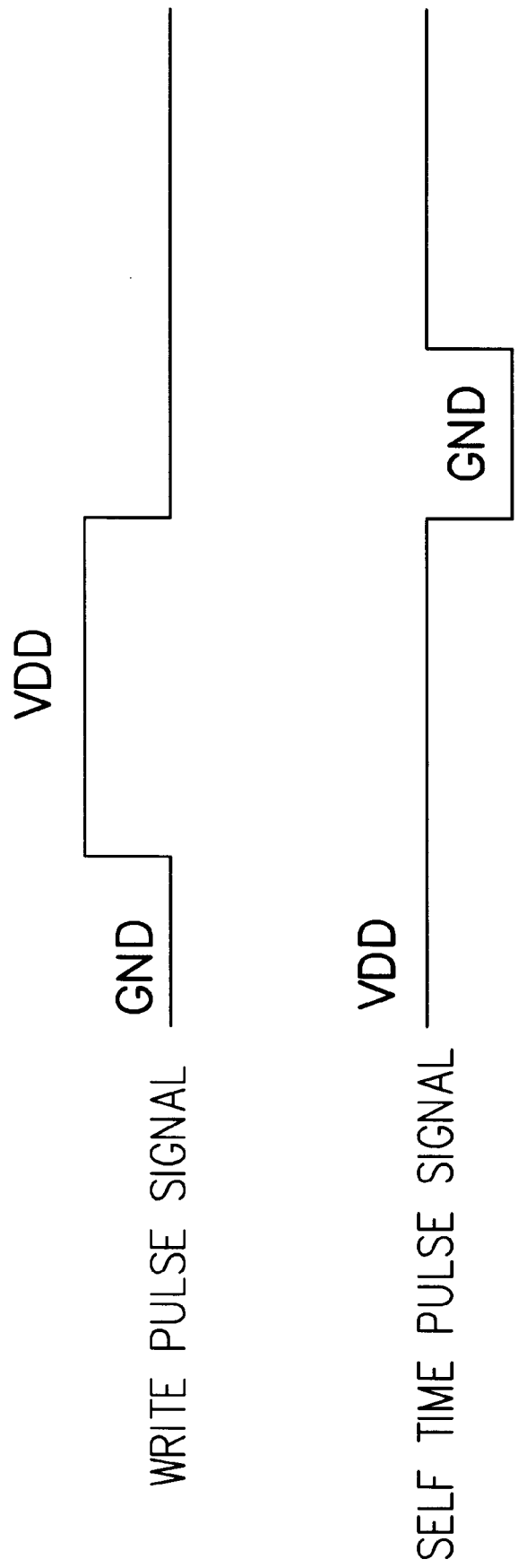
FIG. 3 shows a waveform diagram of a time pulse signal WRB.

An example of the circuit operation of the invention is introduced as follows. Meanwhile, please refer to FIG. 2 and FIG. 3 for waveform diagrams of the self time pulse signal WRB.

Taking an example of writing the last bit of data of "1", after the write pulse signal changes to a low level (such as a GND level), the self time pulse signal WRB is dropped to a low potential, so that the PMOS transistors 222 and 223 are turned on. Since there is a positive potential difference between the bit lines BL and BLB and the potential difference is large enough, so that the PMOS transistor 221 is turned off and the PMOS transistor 224 is turned on. At this moment, the write signal VDDA enters the bit line BL through the PMOS transistor 224 and 223 to speed up the speed for the bit ling BL to swing to "1". In this manner, the time required to write this last bit of data into the memory cell is shortened.

During a read cycle, the self time pulse signal WRB is in a high level, the PMOS transistors 222 and 223 are off, the circuit structure is similar to that of a conventional DRAM, so that the charge sharing is not affected.

Figure 4:
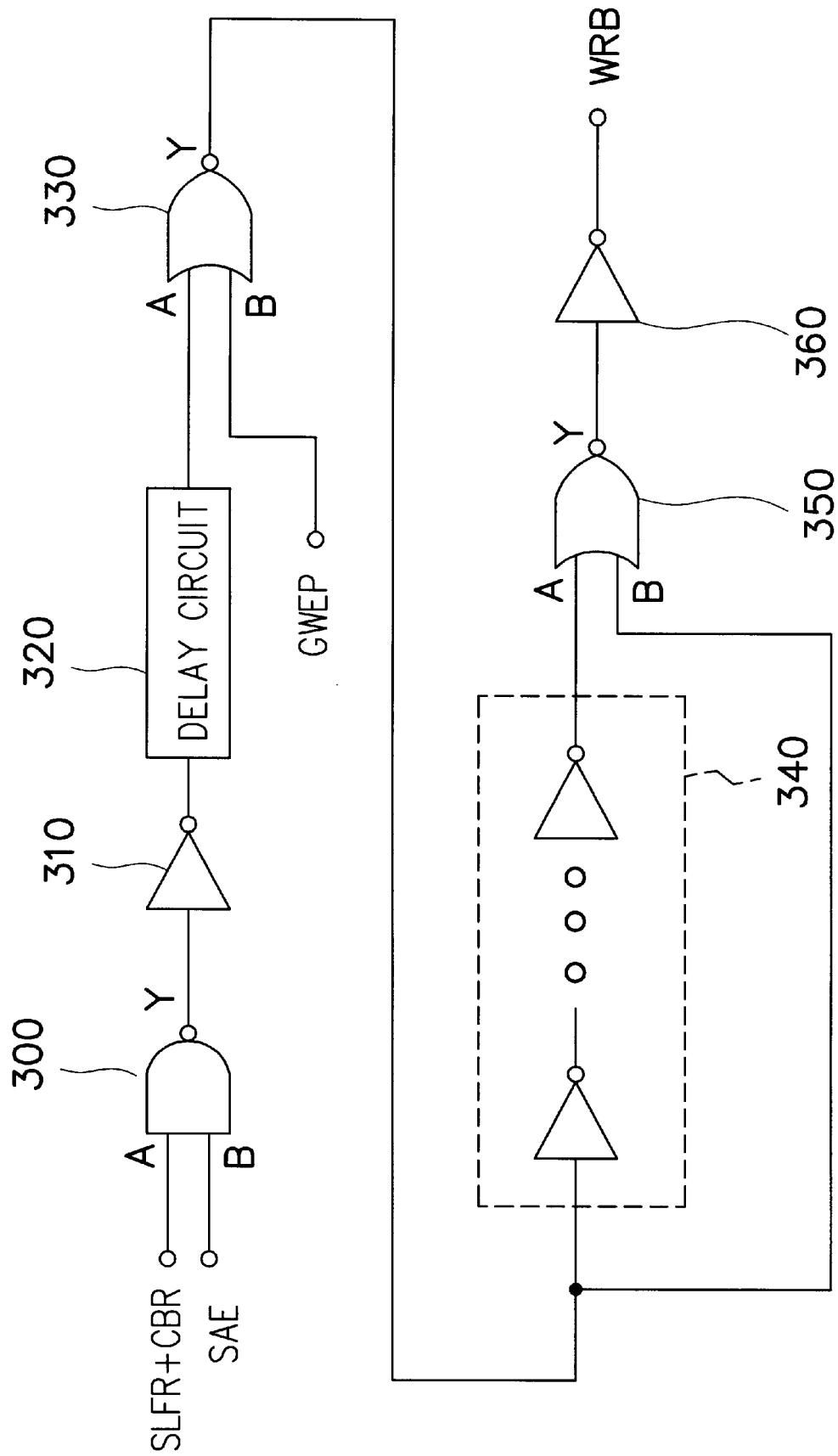
FIG. 4 shows a circuit diagram for generating the time pulse signal WRB.

In addition, the above self time pulse signal WRB can be generated by the circuit as shown in FIG. 4. The circuit comprises an NAND gate 300, inverters 310 and 360, a delay circuit 320 comprising an even number of series-connected inverters, NOR gates 330 and 350, and a delay circuit 340 comprising an odd number of series-connected inverters. In FIG. 4, SLFR is a self-refresh active signal, CBR is a column address strobe (cas) refresh active signal before row address strobe (ras) signal, and SAE is a sense active enabling signal. As shown in the figure, the NAND gate 300 has two input terminals to receive the SLFR signal plus a CBR signal and the SAE signal, respectively. The output terminal of the NAND gate 300 is coupled to an input terminal of the inverter 310, while the inverter 310 has output terminal connected to an input terminal of the delay circuit 320. An output terminal of the delay circuit 320 is coupled to one input terminal of the NOR gate 330, while the other input terminal of the NOR gate 330 is to receive a GWEP (globe write active pulse) signal. The NOR gate 330 further has an output terminal connected to an input terminal of the delay circuit 340. An output terminal of the delay circuit 340 has an output terminal connected to an input terminal of the NOR gate 350 which further has another input terminal connecting to the input of the delay circuit 340. An output of the NOR gate 350 is coupled to an input terminal of the inverter 360 which has an output terminal to output the self time pulse signal WRB.

Figure 5:
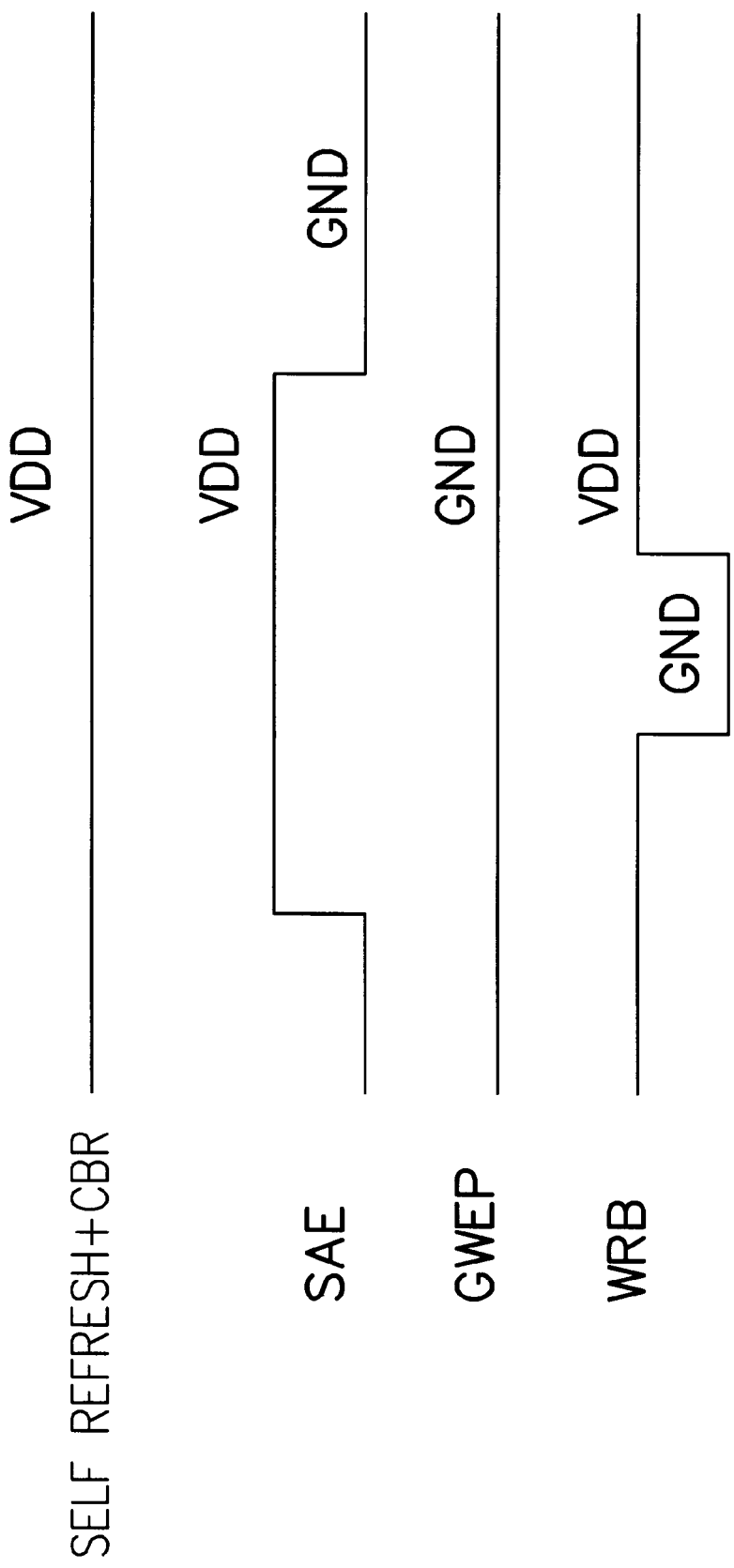
FIG. 5 shows a waveform diagram under the refresh and CBR operation modes.

When a DRAM is operated in a CBR or a self-refresh mode, the circuit in FIG. 4 is controlled by the sense active enabling signal SAE to generate an operation of finishing writing. That is, lower down the potential level of the self time pulse signal WRB to speed up the refresh time as shown as the waveform in FIG. 5.

Therefore, the invention provides a fast write recovery circuit which greatly shortens the write recovery time for a semiconductor memory device. In addition, the operation of high speed writing is executed to prevent from incomplete writing during a transient write cycle.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A semiconductor memory device including a fast write recovery circuit, comprising:

a memory array, including a plurality of memory cells coupled to a pair of bit lines;

a sense amplifier, connecting across the pair of bit lines and a pair of data lines to write data of the pair of data lines into the memory cells of the memory array; and the fast write recovery circuit, including a first PMOS transistor, a second PMOS transistor, a third PMOS transistor and a fourth PMOS transistor, wherein Source regions of the first and the fourth PMOS transistors are to receive a write signal, a gate of the first PMOS transistor is coupled to drain regions of the third and the fourth PMOS transistors, a gate of the fourth PMOS transistor is coupled to drain regions of the first and the second PMOS transistors, gates of the second and the third PMOS transistors are to receive a self time pulse signal WRB, and source regions of the second and the third PMOS transistors are coupled to the pair of the bit lines, respectively, and wherein when the sense amplifier writes a last bit of data, the write signal is written into the memory cell from the fast write recovery circuit at the same time.

2. The semiconductor memory device according to claim 1, wherein the fast write recovery circuit further comprises a circuit to generate the self time pulse signal WRB, the circuit to generate the self time pulse signal WRB comprising:

an NAND gate, with two input terminals to receive a SLFR+CBR signal and a SAE signal;

a first inverter, with an input terminal coupled to an output terminal of the NAND gate;

a first delay circuit, with an input terminal coupled to an output terminal to the first inverter;

a first NOR gate, with two input terminals coupled to an output terminal of the first delay circuit and to receive a GWEP signal;

a second delay circuit, with an input terminal coupled to an output terminal of the NOR gate;

a second NOR gate, with two input terminals coupled to the second delay circuit and the output terminal of the first NOR gate; and a second inverter, with an input terminal coupled to an output terminal of the second NOR gate and an output terminal to output the self time pulse signal WRB.

3. The circuit to generate the self time pulse signal WRB according to claim 2, wherein the first delay circuit comprises an even number of series-connected inverters.

4. The circuit to generate the self time pulse signal WRB according to claim 2, wherein the second delay circuit comprises an odd number of series-connected inverters.

5. The semiconductor memory device according to claim 1, wherein the self time pulse signal WRB is in a low potential level during a write cycle, while the self time pulse signal WRB is in a high potential level during a read cycle.

6. The semiconductor memory device according to claim 1, wherein the semiconductor memory device includes a dynamic random access memory.

7. A semiconductor memory device, comprising:

a memory array, including a plurality of memory cells;

a sense amplifier, connecting across a pair of bit lines and a pair of data lines; and a fast write recovery circuit; wherein while the sense amplifier is writing a last bit of data into a memory cell, the fast write recovery circuit write a write signal into the memory cell at the same time.

8. The semiconductor memory device according to claim 7, further comprising a first PMOS transistor, a second PMOS transistor, a third PMOS transistor and a fourth PMOS transistor, wherein Source regions of the first and the fourth PMOS transistors are to receive a write signal, a gate of the first PMOS transistor is coupled to drain regions of the third and the fourth PMOS transistors, a gate of the fourth PMOS transistor is coupled to drain regions of the first and the second PMOS transistors, gates of the second and the third PMOS transistors are to receive a self time pulse signal WRB, and source regions of the second and the third PMOS transistors are coupled to the pair of the bit lines, respectively.

9. The semiconductor memory device according to claim 8, wherein the fast write recovery circuit further comprises a circuit to generate a self time pulse signal WRB, the circuit to generate the self time pulse signal WRB comprising:

an NAND gate, with input terminals to receive a SLFR+CBR signal and a SAE signal;

a first inverter, with an input terminal coupled to an output terminal of the NAND gate;

a first delay circuit, with an input terminal coupled to an output terminal to the first inverter;

a first NOR gate, with input terminals coupled to an output terminal of the first delay circuit and to receive a GWEP signal;

a second delay circuit, with an input terminal coupled to an output terminal of the NOR gate;

a second NOR gate, with input terminals coupled to the second delay circuit and the output terminal of the first NOR gate; and a second inverter, with an input terminal coupled to an output terminal of the second NOR gate and an output terminal to output the self time pulse signal WRB.

* * * * *